(12) United States Patent
Uebel et al.

(10) Patent No.: US 11,774,671 B2
(45) Date of Patent: Oct. 3, 2023

(54) HOLLOW-CORE PHOTONIC CRYSTAL FIBER BASED OPTICAL COMPONENT FOR BROADBAND RADIATION GENERATION

(71) Applicant: ASML NETHERLANDS B.V., Veldhoven (NL)

(72) Inventors: Patrick Sebastian Uebel, Marloffstein (DE); Peter Maximilian Götz, Bavaria (DE); Sebastian Thomas Bauerschmidt, Wendelstein (DE); Coen Hubertus Matheus Baltis, Eindhoven (NL); Janneke Ravensbergen, Würzburg (DE)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/077,756

(22) Filed: Oct. 22, 2020

(65) Prior Publication Data
US 2021/0124112 A1   Apr. 29, 2021

(30) Foreign Application Priority Data

Oct. 24, 2019  (EP) .................................... 19204985
Dec. 18, 2019  (EP) .................................... 19217381

(51) Int. Cl.
*G02B 6/02*   (2006.01)
*C03B 37/15*  (2006.01)
(Continued)

(52) U.S. Cl.
CPC .......... *G02B 6/02328* (2013.01); *C03B 37/15* (2013.01); *G02B 6/0096* (2013.01);
(Continued)

(58) Field of Classification Search
CPC ............ G02B 6/02328; G02B 6/02347; C03B 2203/16; C03B 2203/42
See application file for complete search history.

(56) References Cited

U.S. PATENT DOCUMENTS

| 6,952,253 B2 | 10/2005 | Lof et al. |
| 6,961,116 B2 | 11/2005 | Den Boef et al. |
| (Continued) | | |

FOREIGN PATENT DOCUMENTS

| CN | 102436065 | 5/2012 |
| CN | 104577677 | 4/2015 |
| (Continued) | | |

OTHER PUBLICATIONS

European Search Report issued in corresponding European Patent Application No. EP20202598, dated Nov. 12, 2020.
(Continued)

*Primary Examiner* — Eric Wong
(74) *Attorney, Agent, or Firm* — Pillsbury Winthrop Shaw Pittman, LLP

(57) ABSTRACT

Optical components and methods of manufacture thereof. A first optical component has a hollow-core photonic crystal fiber includes internal capillaries for guiding radiation and an outer capillary sheathing the internal capillaries; and at least an output end section having a larger inner cross-sectional dimension over at least a portion of the output end section than an inner cross-sectional dimension of the outer capillary along a central portion of the hollow-core photonic crystal fiber prior to the output end section. A second optical component includes a hollow-core photonic crystal fiber and a sleeve arrangement.

21 Claims, 7 Drawing Sheets

(51) Int. Cl.
  *F21V 8/00* (2006.01)
  *G03F 7/00* (2006.01)
  *G03F 9/00* (2006.01)
(52) U.S. Cl.
  CPC ....... *G02B 6/02347* (2013.01); *G03F 7/7085* (2013.01); *G03F 9/7034* (2013.01); *G03F 9/7065* (2013.01); *C03B 2203/16* (2013.01); *C03B 2203/42* (2013.01)

(56) References Cited

U.S. PATENT DOCUMENTS

| | | | |
|---|---|---|---|
| 7,265,364 | B2 | 9/2007 | Teunissen et al. |
| 7,532,792 | B2 * | 5/2009 | Skovgaard ......... G02B 6/02376 385/24 |
| 7,646,471 | B2 | 1/2010 | Teunissen et al. |
| 9,160,137 | B1 | 10/2015 | Abdolvand et al. |
| 2004/0175085 | A1 | 9/2004 | Forbes et al. |
| 2004/0207824 | A1 | 10/2004 | Lof et al. |
| 2004/0258381 | A1 * | 12/2004 | Borrelli ............... G02B 6/04 385/125 |
| 2005/0238301 | A1 * | 10/2005 | Russell ............ C03B 37/02781 385/113 |
| 2007/0165991 | A1 | 7/2007 | Huber |
| 2007/0201802 | A1 | 8/2007 | Mihailov et al. |
| 2007/0237453 | A1 * | 10/2007 | Nielsen .................. G02B 6/262 385/28 |
| 2007/0296960 | A1 | 12/2007 | Den Boef et al. |
| 2008/0069508 | A1 * | 3/2008 | Dong ................. H01S 3/06754 385/127 |
| 2008/0198380 | A1 | 8/2008 | Straaijer et al. |
| 2009/0168062 | A1 | 7/2009 | Straaijer |
| 2010/0007863 | A1 | 1/2010 | Jordanoska |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0308142 | A1 | 11/2013 | Straaijer |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2018/0217323 | A1 * | 8/2018 | Lyngsø~e .......... G02B 6/02357 |
| 2019/0107781 | A1 | 4/2019 | Tinnemans et al. |
| 2021/0396931 | A1 * | 12/2021 | Harker .................. G02B 6/255 |

FOREIGN PATENT DOCUMENTS

| | | |
|---|---|---|
| CN | 104808288 | 7/2015 |
| EP | 1628164 | 2/2006 |
| EP | 3136143 | 3/2017 |
| EP | 3404454 | 11/2018 |
| EP | 3480554 | 5/2019 |
| EP | 3531199 | 8/2019 |
| FR | 3039289 | 1/2017 |
| JP | 2009524835 | 7/2009 |
| NL | 2022805 | 4/2019 |
| NL | 2022892 | 4/2019 |
| NL | 2023515 | 8/2019 |
| TW | 201120495 | 6/2011 |
| WO | 2016102127 | 6/2016 |
| WO | 2017032454 | 3/2017 |
| WO | 2018127266 | 7/2018 |
| WO | 2018210598 | 11/2018 |
| WO | 2019068459 | 4/2019 |
| WO | 2019166190 | 9/2019 |
| WO | 2019197117 | 10/2019 |

OTHER PUBLICATIONS

Taiwanese Office Action issued in corresponding Taiwanese Patent Application No. 109136821, dated Dec. 2, 2021.
European Search Report issued in corresponding European Patent Application No. 19217381.3, dated May 13, 2020.
Office Action issued in corresponding Japanese Patent Application No. 2022-523942, dated Jul. 25, 2023.

* cited by examiner

HOLLOW-CORE PHOTONIC CRYSTAL FIBER BASED OPTICAL COMPONENT FOR BROADBAND RADIATION GENERATION

This application claims the benefit of priority to European patent application no. 19204985.6, filed Oct. 24, 2019 and to European patent application no. 19217381.3, filed Dec. 18, 2019, each of the foregoing applications is incorporated herein in its entirety by reference.

FIELD

The present description relates to a hollow-core photonic crystal fiber based broadband radiation generator, and in particular such a broadband radiation generator in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

SUMMARY

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation source is required. For various reasons, including measurement robustness and accuracy, broadband or white light radiation sources are increasingly used for such metrology applications. It would be desirable to improve on present devices for broadband radiation generation.

In an aspect, there is provided an optical component comprising: a hollow-core photonic crystal fiber comprising internal capillaries for guiding radiation and an outer capillary sheathing the internal capillaries; and at least an output end section having a larger inner diameter over at least a portion of the output end section than an inner diameter of the outer capillary along a central portion of the hollow-core photonic crystal fiber prior to the output end section.

In an aspect, there is provided an optical component comprising a hollow-core photonic crystal fiber and a sleeve arrangement comprising at least one sleeve covering at least respective end portions of each end of the hollow-core photonic crystal fiber, wherein: internal capillaries of the hollow-core photonic crystal fiber are collapsed to define a tapered core region at each end of the hollow-core photonic crystal fiber, the tapered core region comprising a region where a hollow core of the hollow-core photonic crystal fiber has an increasing diameter towards each end of the hollow-core photonic crystal fiber; and contact regions, where the sleeve arrangement contacts the hollow-core photonic crystal fiber, are all at or beyond the tapered core region with respect to a main axis of the hollow-core photonic crystal fiber.

Other aspects of the invention comprise a broadband radiation source and metrology device comprising an optical component as described herein and methods of manufacture of optical component as described herein.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
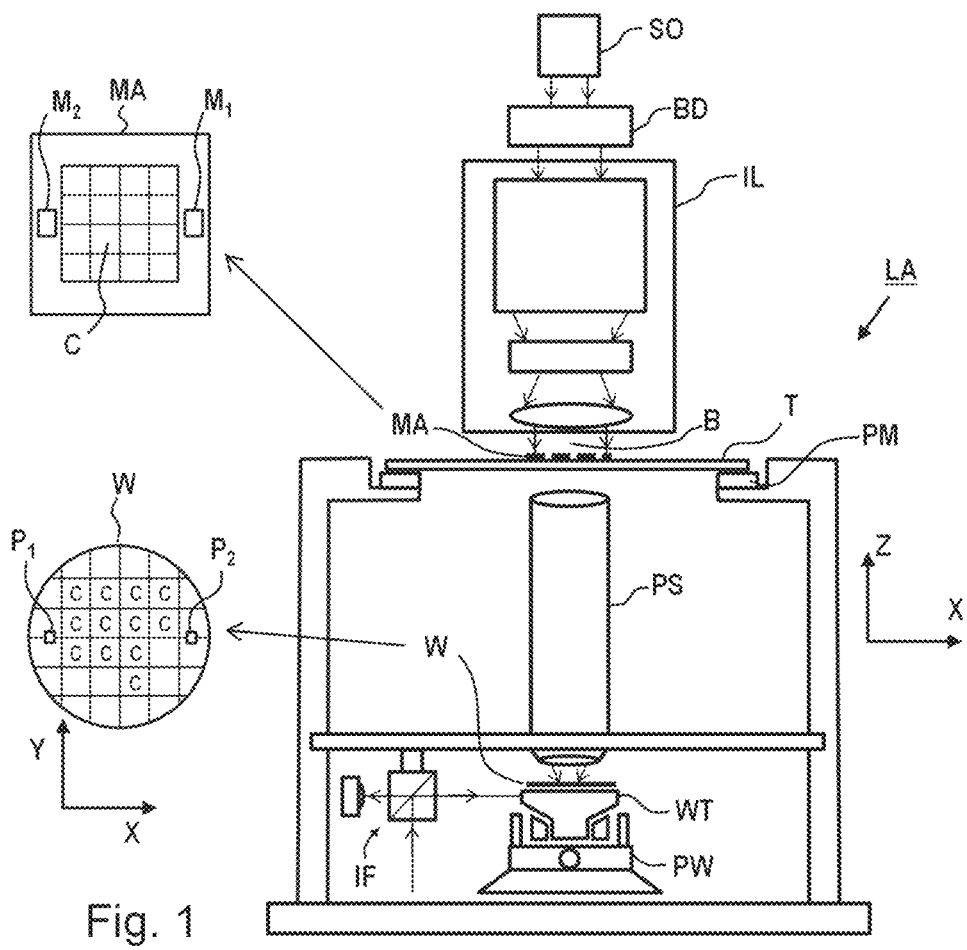
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a patterning device support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
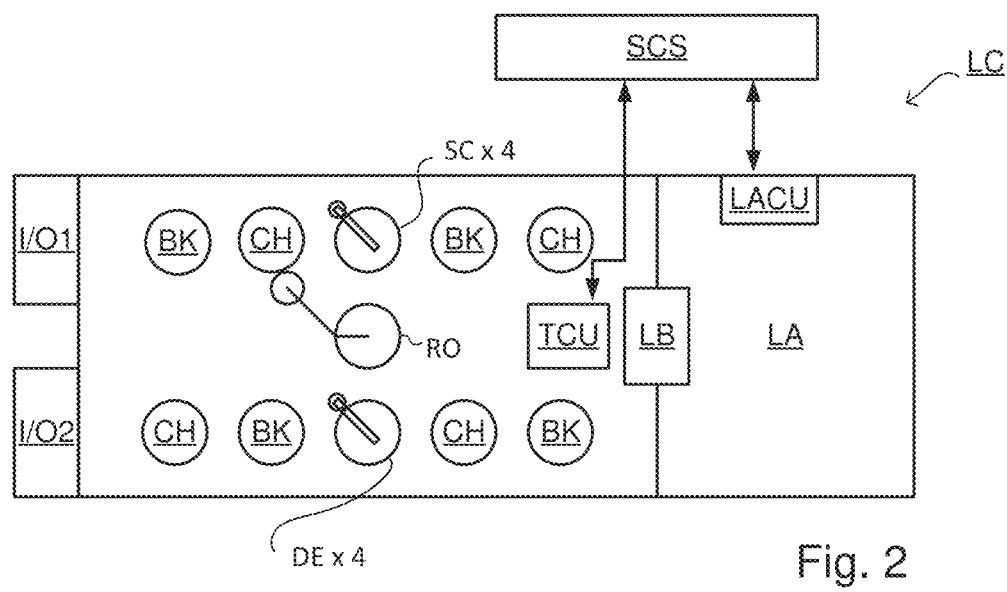
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
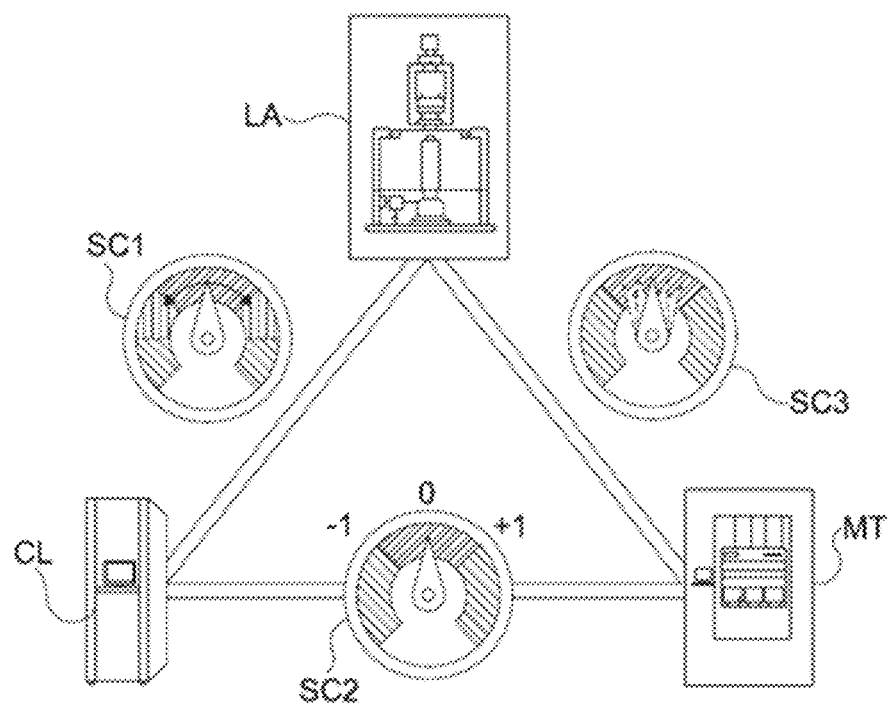
FIG. 3 depicts a schematic representation of holistic lithography, representing a cooperation between three technologies to optimize semiconductor manufacturing.

Typically the patterning process in a lithographic apparatus LA is one of the most critical steps in the processing which involves high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). An objective of such a "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which patterning device pattern layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Examples of metrology tools and associated measurement techniques are further described in U.S. patent application publication nos. US 20100328655, US 2011102753, US 20120044470, US 20110249244, US 20110026032 and European patent application no. EP1,628,164, each of the foregoing publications is incorporated herein in its entirety by reference. Aforementioned metrology tools may measure gratings using radiation from soft x-ray and visible to near-IR wavelength range.

In an embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In an embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In an embodiment, the scatterometer MT is an ellipsometric scatterometer. The ellipsometric scatterometer allows for determining parameters of a lithographic process by measuring scattered radiation for each polarization state. Such metrology apparatus emits polarized radiation (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application publication nos. 2007-

0296960, 2008-0198380, 2009-0168062, 2010-0007863, 2011-0032500, 2011-0102793, 2011-0188020, 2012-0044495, 2013-0162996 and 2013-0308142, each of which is incorporated herein in its entirety by reference.

Figure 4:
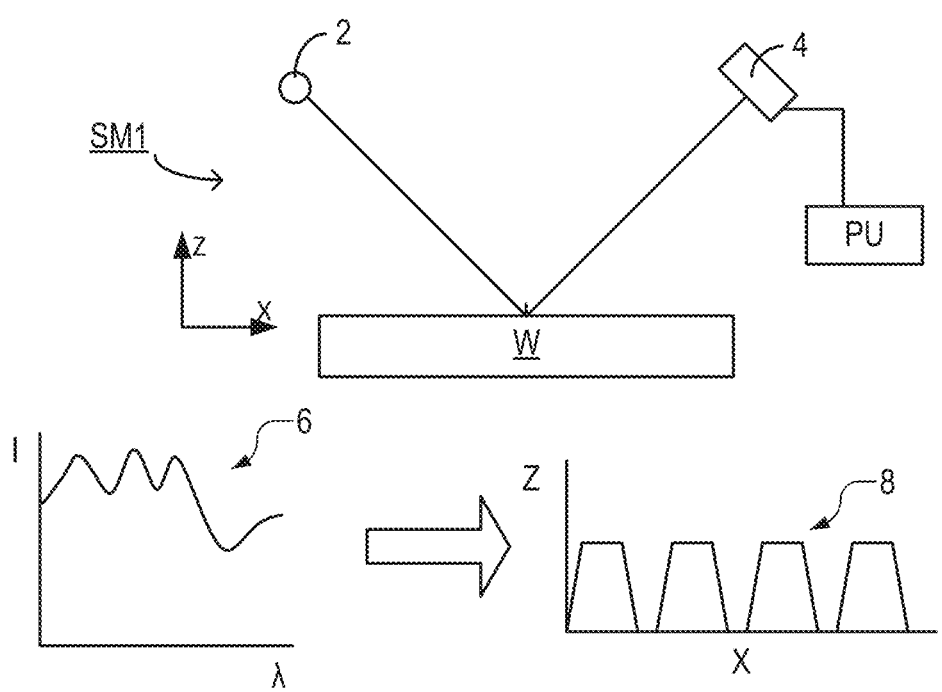
FIG. 4 depicts a schematic overview of a scatterometry apparatus used as a metrology device, which may comprise a radiation source according to an embodiment of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application publication nos. US2016-0161863 and US 2016/0370717A1, which are incorporated herein in their entireties by reference.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
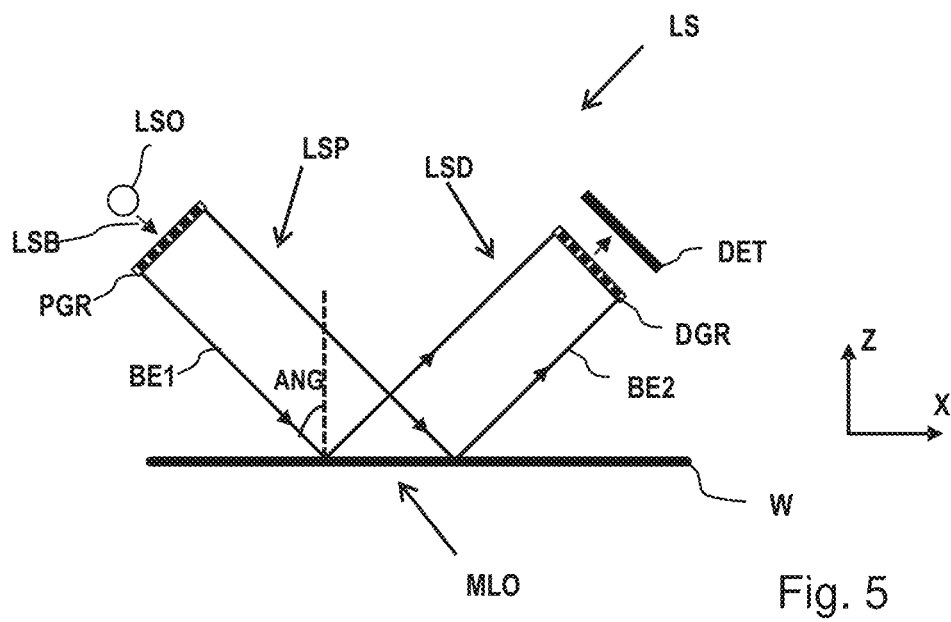
FIG. 5 depicts a schematic overview of a level sensor apparatus which may comprise a radiation source according to an embodiment of the invention.

An example of a level or height sensor LS is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum radiation source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the radiation received, for example indicative of the intensity of the radiation received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, which are incorporated herein in their entireties by reference. A height sensor using UV radiation instead of visible or infrared radiation is disclosed in U.S. patent application publication no. US 2010/233600, which is incorporated herein in its entirety by reference. In PCT application publication no. WO 2016/102127, which is incorporated herein in its entirety by reference, a compact height sensor is described which uses a multi-element detector to detect and recognize the position of a grating image, without needing a detection grating.

Another type of metrology tool used in IC manufacture is an alignment sensor. A significant aspect of performance of the lithographic apparatus is the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor for use a lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. patent application publication no. US 2015/261097, which is incorporated herein in its entirety by reference.

Figure 6:
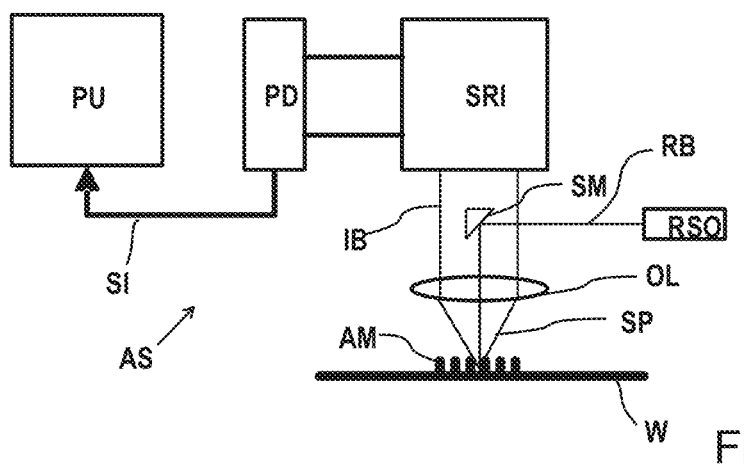
FIG. 6 depicts a schematic overview of an alignment sensor apparatus which may comprise a radiation source according to an embodiment of the invention.

FIG. 6 is a schematic block diagram of an embodiment of an alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in cross-sectional dimension than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

For optical semiconductor metrology, inspection applications, such as in any of the aforementioned metrology tools, a bright radiation source which outputs coherent radiation, simultaneously covering a broad wavelength range (e.g., from UV to IR), is often desired. Such a broadband radiation source can help improve the flexibility and robustness of applications by allowing substrates with different material characteristics to be optically examined in the same setup/system without a need for any hardware change (e.g., changing a radiation source so as to have a specific wavelength). Allowing the wavelength to be optimized for a specific application also means that the accuracy of measurements can be further increased.

Gas lasers, which are based on the gas-discharge effect to simultaneously emit multiple wavelengths, can be used in these applications. However, intrinsic issues such as high intensity instability and low spatial incoherence associated with gas lasers can make them unsuitable. Alternatively, outputs from multiple lasers (e.g., solid-state lasers) with different wavelengths can be spatially combined into the optical path of a metrology or inspection system so as to provide a multiple wavelength source. The complexity and high implementation costs, which increases with the number of wavelengths desired, prevents such a solution from being widely used. In contrast, a fiber-based broadband or white light laser, also called a supercontinuum laser, is able to emit radiation with high spatial coherence and broad spectral coverage, e.g., from UV to IR, and therefore is a very attractive and practical option.

A hollow-core photonic crystal fiber (HC-PCF) is a special type of optical fiber that comprises a central hollow core region and an inner cladding structure surrounding the hollow core, both of which extend axially along the entire fiber. The radiation guidance mechanism is enabled by the inner cladding waveguide structure, which may comprise, for example, thin-walled glass elements. The radiation is thus confined predominantly inside a hollow core and propagates along the fiber in the form of transverse core modes.

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs).

HC-PCFs comprise hollow channels which are filled with a fluid, such that they possess resultant desired characteristics for various radiation guiding applications; for example, high-power beam delivery using HC-PBFs and gas-based radiation generation (e.g., white light, broadband or supercontinuum generation) using HC-ARFs. Detail on the design and manufacture of HC-PCFs can be found in U.S. patent application publication no. US 2004/175085 (for HC-PBFs) and PCT patent application publication no. WO 2017/032454 (for HC-ARFs), which are incorporated herein in their entireties by reference. HC-PBFs are configured to offer low loss but narrow bandwidth radiation guidance via a photonic bandgap effect established by the cladding structure surrounding the central hollow core. Whereas HC-ARFs are engineered to significantly broaden the transmission bandwidth via anti-resonant reflection of radiation from the cladding.

Figure 7A:
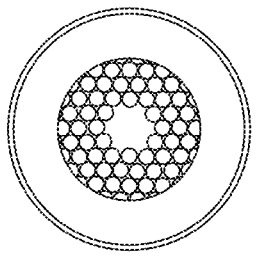
FIGS. 7A, 7B, and 7C schematically depict transverse cross-sections of a number of HC-PCF designs for supercontinuum generation.
Figure 7B:
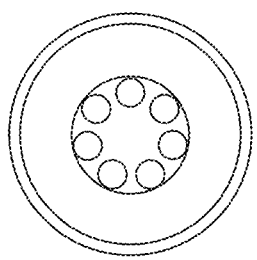

FIG. 7 depicts, in cross-section, a number of types of HC-PCFs, and are examples of HC-PCFs for which the concepts disclosed herein can be used in combination with and/or applied to. FIG. 7A shows a Kagome fiber, comprising a Kagome lattice structure. FIG. 7B shows a single-ring or revolver fibers, where the hollow core region is formed and surrounded by a layer of non-touching rings.

Figure 7C:
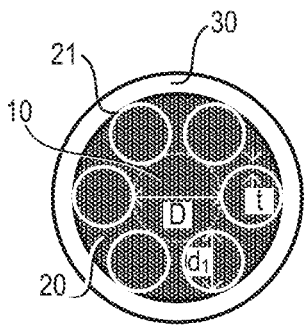

FIG. 7C shows transverse cross-sections of another practical example of a HC-PCFs which is disclosed in PCT patent application publication no. WO 2017/032454. The circles represent the solid material of anti-resonant elements (AREs) or outer cladding region, like quartz glass or silica, while the shaded portions are free of solid materials (evacuated or filled with gas or liquid). The HC-PCF comprises a hollow core region 10 (represented in FIG. 7C by a dotted circle), an inner cladding region 20 with multiple anti-resonant elements (AREs) 21 and an outer cladding region 30. The hollow core region 10 is the empty space, between the AREs 21, extending along the longitudinal length of the HC-PCF and having a smallest transverse core dimension D. The AREs 21 of the inner cladding region 20 may comprise capillaries having a wall thickness t and a smallest transverse ARE dimension d. The AREs 21 may be fixed to the inner surface of the outer cladding region 30. The outer cladding region 30 may comprise a larger capillary being made of e.g. glass and providing a closed cladding of the HC-PCF. The HC-PCF of FIG. 7C illustrates an embodiment wherein the AREs 21 comprise a single-ring of thin-wall capillaries with a circular transverse cross-section arranged within the larger capillary of the outer cladding region 30 in, in this case, six-fold symmetric pattern so as to create a central hollow core of dimension D (the shortest distance between diametrically opposite AREs 21).

The examples of HC-PCFs as shown in FIG. 7C can be modified, in particular with regard to the number of AREs 21. The AREs may number 4 or 5 or 7 or more, for example. The ARE arrangement may be varied in a number of other ways. Each ARE 21 may have e.g., an elliptic or polygonal cross-section; the inner shape of the outer cladding 30 may have e. g. a polygonal cross-section; and the solid materials of the AREs 21, may comprise e.g., plastic material, like PMA, glass, like silica, or soft-glass.

For gas-based radiation generation, a HC-PCF may be comprised within a gas cell, which is designed to operate, for example, at a pressure up to many 10s of bars (e.g., between up to 100 bar). A gas-filled HC-PCF can act as an optical frequency converter when being pumped by an ultrashort pump laser pulse with sufficient peak power. The frequency conversion from ultrashort pump laser pulses to broadband laser pulses is enabled by a complicated interplay of the dispersion and nonlinear optical processes inside the gas-filled fiber. The converted laser pulses are predominantly confined within the hollow core in the form of transverse core modes and guided to the fiber end. Part of the radiation, for example higher order transverse core modes or specific wavelengths, may leak from the hollow core through the inner cladding waveguide structure and undergoes strong attenuation during its propagation along the fiber. The core region and the cladding region of a HC-PCF can be configured such that the higher order core modes are phase matched to the higher order cladding modes.

One or more spatio-temporal transmission characteristics of a laser pulse, e.g. its spectral amplitude and phase, transmitted along a HC-PCF can be varied and tuned through adjustment of one or more pump laser parameters, one or more filling gas parameters and/or one or more fiber parameters. The one or more transmission characteristics may include one or more selected from: output power, output mode profile, output temporal profile, width of the output temporal profile (or output pulse width), output spectral profile, or bandwidth of the output spectral profile (or output spectral bandwidth). The one or more pump laser parameters may include one or more selected from: pump wavelength, pump pulse energy, pump pulse width, pump pulse repetition rate or pump pulse shape. The one or more fiber parameters may include one or more selected from: fiber length, size and/or shape of the hollow core, size and/or shape of the cladding structure (or capillary number), or thickness of the walls surrounding the hollow core. The one or more filling gas parameters may include one or more selected from: gas type, gas pressure or gas temperature. The one or more parameters of the fiber and/or gas may also undergo changes along the fiber, e.g. the fiber could be tapered or there could be a gas gradient.

The filling gas can be a noble gas such as argon, krypton, and/or xenon, a Raman active gas such as hydrogen, deuterium and/or nitrogen, or a gas mixture such as an argon/hydrogen mixture, a xenon/deuterium mixture, a krypton/nitrogen mixture, or a nitrogen/hydrogen mixture. Depending on the type of filling gas, the nonlinear optical processes can include modulational instability (MI), soliton fission, Kerr effect, Raman effect and/or dispersive wave generation, details of which are described in PCT patent application publication no. WO 2018/127266 and U.S. Pat. No. 9,160,137 (both of which are hereby incorporated in their entireties by reference). Since the dispersion of the filling gas can be tuned by varying the gas cell pressure, the generated broadband pulse dynamics and the associated spectral broadening characteristics can be adjusted so as to optimize the frequency conversion. The generated broadband laser output can cover wavelengths from UV (e.g., <200 nm) to mid-IR (e.g., >2000 nm).

Figure 8:
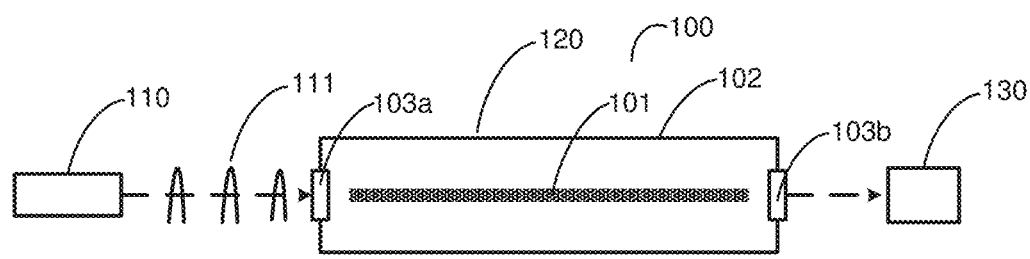
FIG. 8 schematically depicts a gas filled HC-PCF based broadband radiation source device.

As illustrated in FIG. 8, a broadband radiation source device 100 comprises a pump laser 110 outputting a train of pump pulses 111, an optical component 120 spectrally broadening the input pump pulse and, e.g., an optical diagnostic device 130 measuring the output broadband spectrum. The optical component 120 comprises a HC-PCF (e.g., a HC-ARF) 101 having a specific fiber length and a gas cell 102 filled with a working gas or a gas mixture at a specific pressure or with a pressure distribution. The gas cell 102 further comprises an input optical window 103a and an output optical window 103*b*, located at respective ends of the gas cell 102. The input optical window 103*a* is operable to admit ultrashort pump laser pulses into the gas cell 102 via the window. After being coupled into the gas-filled HC-PCF 101, pump laser pulses 111 propagate along the fiber where they experience significant spectral broadening. Resultant broadband laser pulses are subsequently discharged from the gas cell 102 via the output optical window 103*b* and, e.g., are measured by the optical diagnostic device 130 (e.g. a spectrometer).

To fill the HC-PCF 101 with a working gas, the gas cell 102 may be in communication with a pressurized gas supply or reservoir (not shown). The inner surfaces of the walls and windows 103*a*, 103*b* of the gas cell 102 enclose a cavity. The axis of the gas cell is parallel to the axis of the HC-PCF 101.

Typically, a HC-PCF, when used in metrology applications as described herein, is supported at least at both of its ends using mounts which position the fiber relative to a fixed point within the optical system. Mounting methods include the use of adhesives, tape and clamping forces applied via slotted ferrules, V-grooves, using spring-loaded holders or magnets. As disclosed in Netherlands patent application publication no. NL2023515A, which is incorporated herein in its entirety by reference, the use of these methods may not be suitable for gas-based supercontinuum (or white light) sources. The reasons for this include, for example, the outgassing of, for example, adhesives, resulting in contamination and reduced lifetimes, and/or the stress induced on the HC-PCF, which deteriorates the optical performance. In Netherlands patent application publication no. NL2023515A, it is described that these shortcomings can be mitigated by using a mount designed to have a symmetric stress distribution with respect to the inner HC-PCF structure.

When operating a HC-PCF based radiation source, contaminants may grow on the end facets of the HC-PCF over time. In particular, contamination growths tend to develop predominantly on the output facet of a HC-PCF. The growth of contamination appears to occur where the intensity of the radiation is high. Growth of contamination also appears to occur where the radiation has been spectrally broadened, in particular, contaminations do not grow as strongly on the input facet. In addition, contaminations are predominantly observed on the output facet of the HC-PCF, and not inside the HC-PCF itself.

The contaminants may develop due to silica particles being ablated from the windows of the gas cell, or from the HC-PCF. Contaminants may undergo a photo-induced process with the broadened output radiation from the PCF and change their chemical structure and/or crystallize on the output facet. After a certain amount of hours in operation (e.g., after a certain dose (J) of laser energy has been transmitted), this contamination results in the fiber's performance being degraded; this degradation may be referred to as the glassy growth phenomenon (GGP). GGP may relate to mobilization of silicon (as atoms, or volatile species, such as $SiH_4$) via physical or chemical sputtering and/or to plasma-induced or temperature-induced deposition at the output end of the fiber.

The buildup of these contaminants results in a decreased lifetime of the radiation source. GGP and the resultant contamination growths at the output facet can protrude into the optical path of the diverging beam. This causes scattering of the output radiation and thus leads to the decay of output power of the radiation source. GGP can shorten the lifetime of the source; GGP causes radiation scattering and therefore the fiber loses its performance. This may result, for example, in the desired photon budget for the sensor not being met after a certain period of time. Also, GGP may cause drift of the radiation source power/spectral density and mode profile which, if unresolved, will involve frequent re-calibrations. As such, the short lifetime of the fiber can mean frequent fiber swaps in the field.

To reduce contamination growth on the end facets of the HC-PCF, the capillaries of the HC-PCF may be collapsed. Tapered ends of capillaries may help prevent the contamination growths from occurring. However, this solution does not address the underlying problem of contaminants in the apparatus, and contamination growth cannot be fully avoided, particularly if the taper in the capillaries is not perfect.

Improved methods and arrangements for increasing the lifetime of a HC-PCF will now be described. In some embodiments, this may comprise improved methods of mounting a HC-PCF within a supercontinuum radiation source. Further methods may comprise improving the HC-PCF geometry to reduce formation of GGP.

HC-PCF Bulb

In an embodiment, it is proposed to dispense with the gas cell 102 entirely. Instead, it is proposed to use the hollow regions within the HC-PCF 101 (i.e., within the actual fiber) as the main gas reservoir. Such a concept can be thought of as being similar to that of a conventional light bulb used in lighting applications. Hence, the proposed HC-PCF arrangement of this embodiment will be referred to as a HC-PCF bulb throughout the description.

Figure 9A:
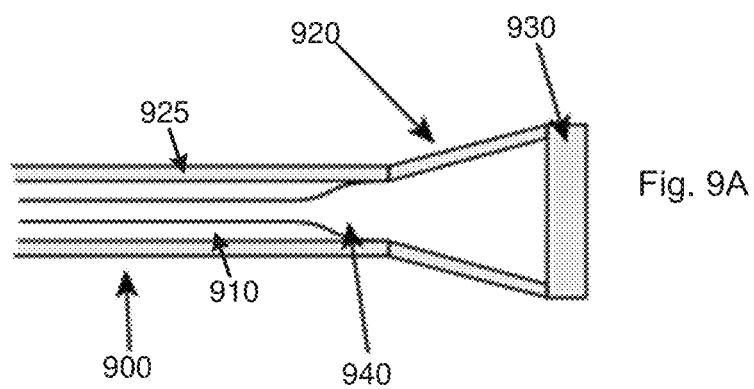
FIG. 9A schematically depicts an embodiment of a gas filled HC-PCF bulb.
Figure 9B:
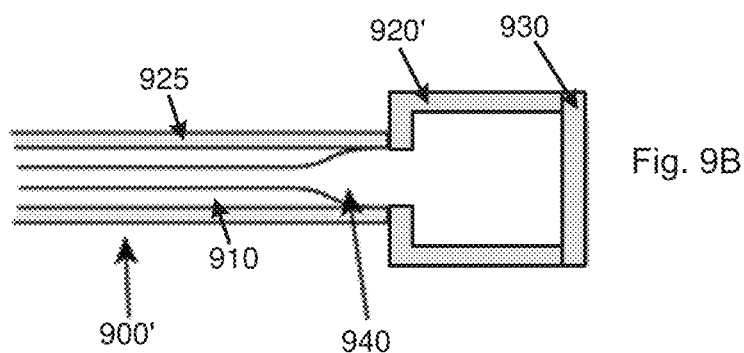
FIG. 9B schematically depicts an embodiment of a gas filled HC-PCF bulb.

FIG. 9 illustrates one end of a combined HC-PCF bulb 900, 900' according to two example such embodiments. In each case, the other end may be essentially similar, or else a HC-PCF fiber 910 may have an arrangement of FIG. 9A at one end and of FIG. 9B at the other (or any other combination which falls within the scope of this disclosure).

In each embodiment, the end of the HC-PCF fiber 910 comprises an end section or outer end capillary 920, 920' and end cap 930. The outer end capillary 920, 920' comprises a larger inner cross-sectional dimension (e.g., diameter) than an inner cross-sectional dimension (e.g., diameter) of the HC-PCF fiber 910 over at least a portion of the outer end capillary 920, 920'. In the embodiment of FIG. 9A, the outer end capillary 920, 920' may be spliced to each end of HC-PCF fiber 910 and sealed by end caps (e.g., transparent windows) 930. The end caps 930 may be made of glass, for example. The end caps 930 can also comprise an input lens at one end for in-coupling the pump beam and/or an output lens at the other end for collimating the output beam (or optionally the lenses may be separate).

In FIG. 9A, the outer end capillary 920 comprises tapered outer end capillaries 920 which are each tapered outward (e.g., defining an expanding inner cross-sectional dimension from the inner cross-sectional dimension of the HC-PCF fiber outer capillary or outer jacket 925 along the length of the HC-PCF fiber 910 towards the end caps 930). This is because the ultrashort laser beam of the pump laser could irreversibly damage an end cap attached directly to the HC-PCF fiber 910. Additionally, the local capillary cross-sectional dimension (e.g. diameter) should be considerably larger than the focused/diverging laser beam at the input/output end. In FIG. 9B the end section or outer end capillary 920' comprises a largely uniform inner cross-sectional dimension which is larger than the inner cross-sectional dimension of the HC-PCF fiber outer capillary 925. It can be appreciated that these are only examples, and any configuration having end sections with a larger inner cross-sectional dimension for at least a portion of the end section, such that divergent broadband radiation emitted from HC-PCF fiber 910 is not blocked by a respective end section in an axial propagation direction from the end of the HC-PCF fiber 910 (or focused pump radiation is not blocked from entering the HC-PCF fiber 910), falls within the scope of this disclosure.

Splicing the outer end capillaries 920, 920' to an HC-PCF fiber 910 may be performed using commercially available fiber splicing machines (e.g. using electric arcs, filaments), or alternative methods such as flames or lasers. During the splicing of the end capillary 920, 920' with the HC-PCF fiber outer capillary 925, the internal capillaries of the HC-PCF fiber 910 may be collapsed, forming a widening or tapered core region 940 (expanding the hollow core cross-sectional dimension toward the fiber end). This can improve the lifetime of the supercontinuum source, as is described in European patent application publication no. EP3404454, which is incorporated herein in its entirety by reference. Splicing the end cap 930 onto the end capillary 920, 920' can be accomplished similarly. Alternatively, the collapsing of the internal capillaries can be performed in in an initial step, followed by a second step of performing the splicing.

The filling of the pressurized gas into the HC-PCF should be performed before the last splice is made. Because pressures of some tens of bars are used, any heat dissipated into the glass may result in fiber inflation. Established methods for the fabrication of pressurized glass light bulbs or plasma lamps may be adapted to make a HC-PCF bulb 900 as disclosed herein. Such methods may comprise inserting the HC-PCF bulb 900 (prior to the final splice) into a container which has been evacuated (to remove any gas from the HC-PCF bulb 900) and flushing the HC-PCF bulb 900 with pressurized gas. The final splice is then made in a high-pressure environment so not to locally inflate the HC-PCF fiber 910. Provided the splices form leak-tight connections, the HC-PCF bulb 900 will keep the pressurized gas confined when removed from the container. An alternative method may comprise inserting a nozzle between one of the connections (e.g., connection between end capillary 920, 920' and end cap 930), and using the nozzle to inject the pressurized gas. By heating the fiber while rapidly removing the nozzle, the last open connection may be sealed while maintaining the pressurized gas within the HC-PCF bulb 900.

While the working gas mainly consists of relatively large atoms (e.g., krypton) which have a low diffusion in silica, hydrogen may also be initially added to help increase lifetime of the HC-PCF bulb 900. This hydrogen will tend to diffuse more rapidly out of the HC-PCF bulb 900. The HC-PCF bulb 900 may, in certain applications, be inserted in an environment which has the same or similar partial pressures of hydrogen than those initially present inside the HC-PCF bulb 900. The gas consumption of the HC-PCF bulb 900 is ultimately provided by the solubility and diffusivity of the working gas in fused silica (or more generally the HC-PCF bulb 900 material) and by the fidelity of the splicing points at which the end capillaries 920, 920' are spliced to the main HC-PCF fiber 910 (in an embodiment). Compared to an external gas cell, any O-ring connections (or multi-material sealants or adhesives) are avoided, reducing gas leakage.

While the axial dimension of HC-PCF 900 is not changed with respect to a conventional gas cell arrangement of FIG. 8, the lateral dimensions may be reduced to a sub-mm scale. This reduces the cross-sectional dimension (e.g., diameter) compared to a current gas cell concept (e.g., 5 cm diameter) by a factor of about 20-100 times. A minimized gas volume and tubular design may improve safety aspects compared to a gas cell concept.

The overall low-volume gas reservoir of the HC-PCF bulb 900 minimizes the number density of atoms/molecules of the working gas. Consequently, the number of contaminants will be considerably reduced. Compared to a typical gas cell, the contaminant number density may be reduced by a factor of 100× or greater (e.g., when assuming an internal gas cell diameter of 1 mm—which is actually smaller than is typical presently—and a hollow diameter of the HC-PCF bulb 900 disclosed here of 0.1 mm). Additionally, the HC-PCF bulb 900 may be fabricated from inert materials (silica and the working gas). Consequently, any contaminants from unclean surfaces (e.g. from lubricants used during production of the metal gas cell) or organic molecules from O-rings are avoided.

To mount the HC-PCF bulb 900, it may be clamped at a point on the capillaries 920, 920'. Consequently, any mechanical stress on the actual waveguide (fiber 940) is avoided. This should enable the use of industrialized mounting concepts, in contrast to the special mounts used to mount HC-PCFs in an external gas cell.

In an external gas cell, the polymer coating of the HC-PCF fiber should be carefully removed, because outgassing otherwise contaminates the gas environment and reduces the lifetime of the supercontinuum source. In an HC-PCF bulb 900 as disclosed here, it may be desirable to keep the fiber coating intact, or even enhance the coating for additional protection (e.g., using a recoating machine). This increases stability and protects the HC-PCF bulb 900 from environmental effects (e.g., scratches, mechanical impacts).

It is expected that costs for such a HC-PCF bulb 900 will be reduced compared to an external gas cell design. There will no longer be production costs for the metal gas cells. While, of course, there will be production costs for the HC-PCF bulb 900, the material cost will be largely negligible as it comprises only glass, and the machines involved do not involve cost-intensive machining tools (e.g., CNC machines).

Sleeved HC-PCF for Improved Mounting

As has already been described, Netherlands patent application publication no. NL2023515A describes a number of mounting arrangements which provide a more symmetric stress distribution than conventional mounts. Netherlands patent application publication no. NL2023515A discloses a mounted hollow-core fiber arrangement comprising a HC-PCF, and a mount arrangement, where the mount arrangement comprises a plurality of mounting contacts configured to apply a force to an outer layer of the hollow-core fiber. A portion of the hollow-core fiber is located in a receiving region of the mount arrangement. The plurality of mounting contacts are positioned around the receiving region. The mounting contacts are distributed around the receiving region, the distribution of the mounting contacts corresponding to a distribution of features of the microstructure of the hollow-core fiber. In particular, the distribution of the mounting contacts may help ensure a symmetric stress distribution (e.g., maximize symmetry of the stress distribution).

Figure 10:
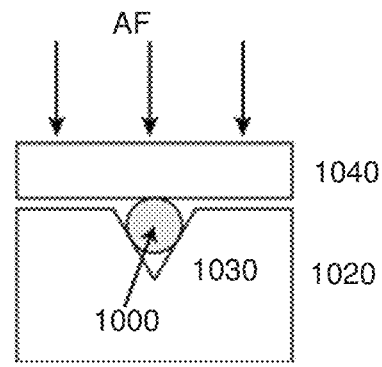
FIG. 10 schematically depicts a mounting arrangement usable for mounting optical devices as disclosed herein.

FIG. 10 shows an example mounting arrangement as disclosed in Netherlands patent application publication no. NL2023515A. A HC-PCF fiber 1000 is located within a receiving region 1030 of the mounting arrangement. The mounting arrangement comprises a base 1020 and lid 1040. An (e.g., adjustable) force AF can be applied to the lid 1040 (or both lid and base) so that they are pressed towards each other. The force may be applied, for example, via a spring-loaded screw, electrical arrangement (e.g., via electrostatic attraction using oppositely charged plates on either side of the mount arrangement) or magnetic arrangement (e.g., using magnets on either side of the mount arrangement). Base 1020 may comprise a groove defining the receiving region 1030. In the example shown, the groove is a V-shaped groove. However the groove or grooves (e.g., there may be complementary grooves in base 1020 and lid 1040) may define a receiving region 1030 having a polygonal shape (e.g., pentagonal or hexagonal), a curved shape or an irregular shape.

As is described in Netherlands patent application publication no. NL2023515A (and illustrated by FIG. 8 in that publication), application of too high a clamping force deteriorates the optical performance of the supercontinuum source. However, even when using the mounting arrangement of FIG. 10, the allowed clamping forces (i.e., before such performance deterioration) are likely to be insufficient to robustly mount the fiber, in particular against shocks and vibrations imposed in an industrialized environment. To enable higher clamping forces, either the concept of fiber mounting concept needs to ensure a more symmetric stress distribution or the fiber needs to be more stress-resistant. The former is addressed in Netherlands patent application publication no. NL2023515A, and a significant further improvement in the stress distribution symmetry may not be achievable in practice. Making the fiber more stress-resistant requires a different fiber structure (e.g., larger fiber outer diameter or in-fiber stress absorbers as disclosed in Netherlands patent application publication no. NL2022892A, which is incorporated herein in its entirety by reference). However, these concepts need experimental validation and may prove challenging to implement.

Disclosed herein is a hybrid concept, where the HC-PCF fiber is inserted into a capillary (e.g., a sleeve). The sleeve has a bore inner cross-sectional dimension (e.g., diameter) that is (slightly) larger than the outer cross-sectional dimension (e.g., diameter) of the HC-PCF fiber. The sleeve can then be clamped robustly by an appropriate mount, e.g., any of the mounts disclosed in Netherlands patent application publication no. NL2023515A and illustrated in FIG. 10. An advantage of such an arrangement is that the clamping force can be relatively strong (e.g., sufficient for industrialization and stronger than possible when directly applied to the fiber), while the force is not applied directly onto the HC-PCF and, consequently, does not impair optical performance.

FIG. 11 illustrates a number of embodiments according to this concept. In each of the embodiments shown, the HC-PCF fiber 1100 is inserted into a sleeve 1130 at each end. Each of these sleeves may have a slight tapered profile 1140 at one end. Note that this tapered profile 1140 is optional, and the HC-PCF 1100 may alternatively be incorporated within an axially homogeneous sleeve. In an embodiment, the end of the HC-PCF fiber 1100 may be inserted into the tapered sleeve 1130 until flush with the tapered profile 1140 (at contact point 1150). Such an embodiment has an advantage that the spacing between HC-PCF fiber 1100 and sleeve 1130 acts as an additional spring when the sleeve is clamped.

Figure 11A:
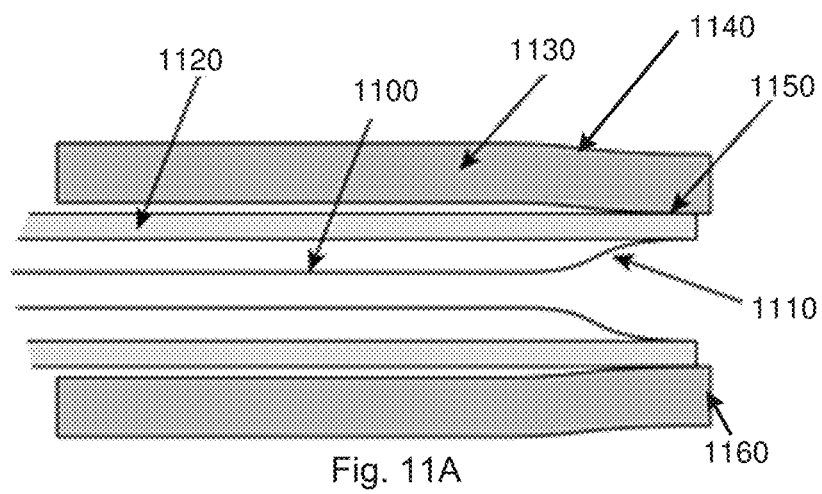
FIG. 11A, FIG. 11B and FIG. 11C schematically depict examples of optical components in three different configurations.
Figure 11B:
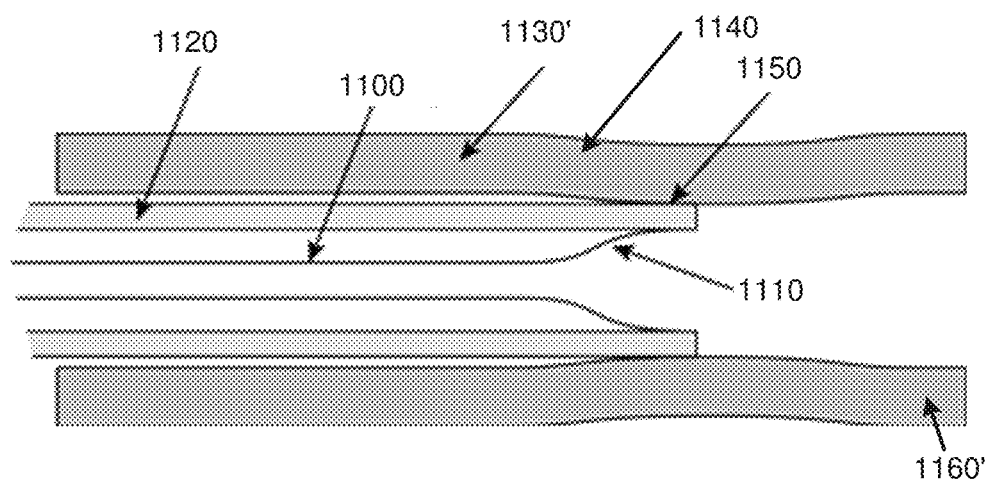

In FIG. 11A, both the HC-PCF fiber 1100 and sleeve 1130 terminate at or close to the same position 1160 such that there is little or no sleeve beyond the HC-PCF fiber 1100 at each end (FIGS. 11A and 11B show only one end; both ends will be similar). In FIG. 11B an embodiment is shown where the sleeve 1130' protrudes 1160' from the end facet of the HC-PCF fiber 1100. This improves clamping and has an additional advantage of lowering the gas turbulence and contamination build-up, potentially improving system lifetime.

Figure 11C:
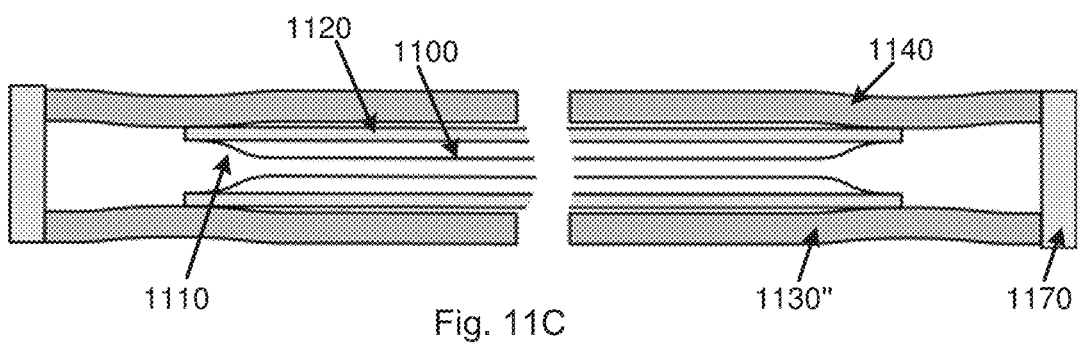

FIG. 11C illustrates an embodiment where, instead of there being a sleeve at each end, a single sleeve 1130" is provided which extends along the entire fiber 1100. In the embodiment shown, the fiber may protrude at both ends (in a similar manner to that shown in FIG. 11B), with the ends of the sleeve being sealed by an end cap 1170 comprising a respective transparent window (e.g., an input window for receiving pump laser radiation and an output window for outputting the broadened radiation). In this manner, the sleeve can function as, and effectively replace, the gas cell (e.g., gas cell 102 of FIG. 8). This has an advantage of a low-volume gas cell compared to a conventional gas cell arrangement. The end caps 1170 can comprise an input lens at one end for in-coupling the pump beam and/or an output lens at the other end for collimating the output beam.

To help ensure defined clamping, a robust connection between sleeve 1130, 1130', 1130" and HC-PCF 1100 should be established; e.g., forming a chemical connection between sleeve and HC-PCF. One proposed method comprises collapsing the sleeve 1130, 1130', 1130" onto the HC-PCF 1100. This may be realized by using a sleeve material which has a lower transition temperature ($T_g$) than the HC-PCF 1100 material (which typically comprises silica having $T_g \approx 1200°$ C.). As an example, borosilicate glass may be used, which has a transition temperature of $T_g \approx 165°$ C. Other examples comprise soft glasses, such as chalcogenides or tellurites. However, a lower transition temperature is not necessary and this method of collapsing the sleeve also works when the sleeve material is the same material as the fiber (e.g., silica). Collapsing may be achieved by locally heating the sleeve-HC-PCF hybrid structure (e.g., apply heating by flame, filament, electric arc or laser radiation) while adjusting heating strength and heating time until a robust mechanically connection is realized, without distorting the local HC-PCF structure.

It should be noted that the collapsing of a sleeve on the HC-PCF introduces stress. This becomes more pronounced for larger differences in the thermal expansion coefficient between the materials (The thermal expansion coefficient for the HC-PCF is about $0.57 \times 10^{-6}/°$ K in the 0 to 200° C. range; the thermal expansion coefficient for borosilicate is about 5 times larger). As, e.g., described in Netherlands patent application publication no. NL2023515A, this will likely deteriorate the optical performance of the radiation source. To address this, it is proposed in an embodiment that the position of local collapsing be decoupled from the waveguiding region of the HC-PCF. As has already been described in relation to the HC-PCF bulb embodiment, the HC-PCF may be processed to fabricate tapers 1110 at both ends (e.g., to improve the lifetime of the source as described in European patent application publication no. EP3404454, which is incorporated herein in its entirety by reference); this may be done by collapsing the thin-walled internal capillaries, before ensleeving, therefore defining a region where the hollow core cross-sectional dimension increases towards the end. In this region (which is typically some hundreds of μm long) the HC-PCF is not actually a waveguide, and therefore this region is locally more stress-resistant. Provided the collapsed sleeve is within the tapered region 1110, the induced stress should not (or only to a reduced extent) impair the optical performance, while still providing a robust mounting solution.

As such, it is proposed that the sleeved HC-PCF (of any of the embodiments described) is assembled with the collapsed sleeve region 1140 (sleeve taper region) positioned to coincide with the HC-PCF internal tapered region 1110. More particularly, it is proposed that any contact areas where the sleeve arrangement contacts the hollow-core photonic crystal fiber are at or beyond the tapered core region along the hollow-core photonic crystal fiber axis (beyond the tapered core region in this context means beyond the tapered core region in a direction toward a respective end). A contact area between sleeve 1130 and fiber 1100 may comprise an axial length which is smaller than and coincident with the tapering length, such that the contact area and a main waveguide region of the HC-PCF do not coincide along the axial length.

Trumpet HC-PCF

As has been described, the glassy growth phenomenon which is a main contributor to limited lifetime of HC-PCFs is primarily seen on the output end facet of the fiber, in particular at the sharp edges of the capillaries and at the edges of the outer capillary or outer jacket which sheathes the optical fiber.

In this embodiment, arrangements which move the fiber's glass outer jacket further away from the diverging beam and/or which effectively avoids any open glass cross section at the end facet of the fiber will be described. The arrangement may be such that the hollow core remains unobstructed to allow the radiation beam to be used downstream. Such a modified fiber may dramatically reduce the growth rate of glassy material as nucleation/condensation sites are effectively moved away from the strong electric fields of the beam.

To realize this modified fiber, it is proposed to create a trumpet shape at the fiber end. Such an arrangement may be similar to some of the HC-PCF bulb embodiments described above, but without the sealing end caps (e.g., such that the fibers of this embodiment may be used within a more conventional gas cell arrangement). The trumpet shape may be, for example, formed by shaping the fiber output end section, or attaching/joining a suitably shaped output end section.

As such, an output end section of the HC-PCF fiber may comprise a larger inner cross-sectional dimension (e.g., inner diameter) over at least a portion of the output end section than an inner cross-sectional dimension (e.g. inner diameter) of the outer capillary/jacket along a central portion of the hollow-core photonic crystal fiber prior to the output end section. This central portion may relate to the main portion of the fiber length, or else the inner cross-sectional dimension at the half way along the length of the HC-PCF. Essentially, in a central portion between any tapering of the inner capillaries or any enlarged end sections, the HC-PCF inner cross-sectional dimension may typically be nominally constant along the length, ignoring any unwanted variation due to processing defects/variation or damage over time.

The dimensions for the core inner cross-sectional dimension and outer cross-sectional dimension before expansion may be 30+/−10 µm and 125+/−25 µm, respectively. After expansion, these dimensions may vary with the manufacturing method used, but the core inner cross-sectional dimension $D_{co}$ may range from 100 µm to 4.5 mm and the outer cross-sectional dimension $D_{out}$ may range from 150 µm to 7 mm. More specific ranges, per manufacturing method, will be described below.

Figure 12:
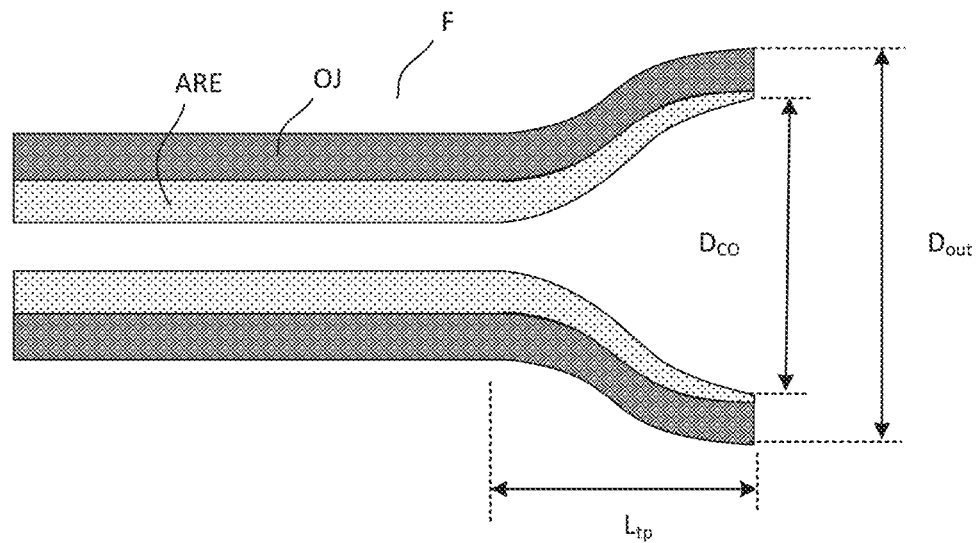
FIG. 12 schematically depicts an enlarged end section of a HC-PCF according to an embodiment of the invention.

FIG. 12 shows a schematic drawing of one end of a HC-PCF fiber F, where the fiber end (i.e., both the internal capillaries or anti resonant elements AREs and outer capillary or outer jacket OJ) is outwardly tapered, i.e., away from the fiber's longitudinal axis. In addition, the internal capillaries AREs may be collapsed in this outwardly-tapering region (the region extending along the length $L_{tp}$). The internal capillaries AREs may extend to the fiber end as illustrated, or may be terminated before the end. In the latter case, the internal capillaries may be blended into the outer jacket OJ, to avoid formation of nucleation sides for glassy growth. Such a HC-PCF fiber F may be manufactured using either of the glassblowing methods described below and illustrated in FIGS. 14A and 14B, for example.

Figure 13:
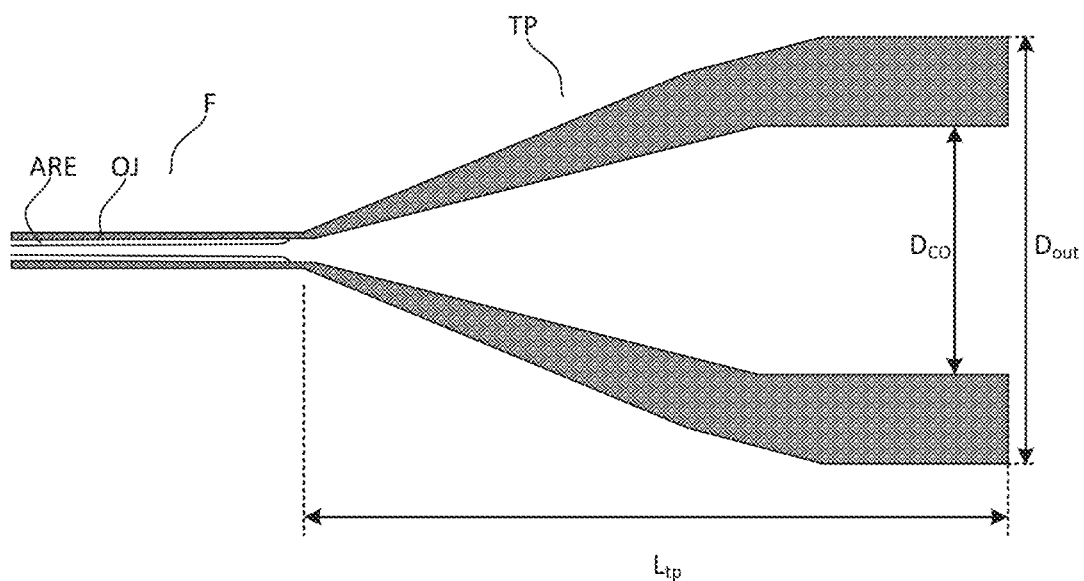
FIG. 13 schematically depicts an enlarged end section of a HC-PCF according to an embodiment of the invention.

FIG. 13 shows a HC-PCF fiber F comprising a separately manufactured glass trumpet TP (extending along the length $L_{tp}$), which is attached (e.g., butt-coupled or spliced) to the fiber F. The internal capillaries ARE of the fiber may be collapsed and, as shown, may also be blended into the outer jacket OJ. In this embodiment, an open glass cross section at the fiber end can be avoided or at least considerably reduced. Such a HC-PCF fiber F may be manufactured using either of the splicing methods described below and illustrated in FIGS. 14C, 14D and 14E, for example.

A number of methods for manufacturing the trumpet ends of this embodiment will now be described. It should be noted that these methods may also be used to manufacture the HC-PCF bulb embodiments described above, with the additional steps in that embodiment of filling the fiber with a working gas and attaching/splicing end caps or windows to seal in the working gas. Two of the methods rely on creating a pressure difference between the fiber interior and exterior while applying heat; also known as glassblowing. The two other methods rely on creating a trumpet separately and fusing it to the end-facet of the fiber.

Figure 14A:
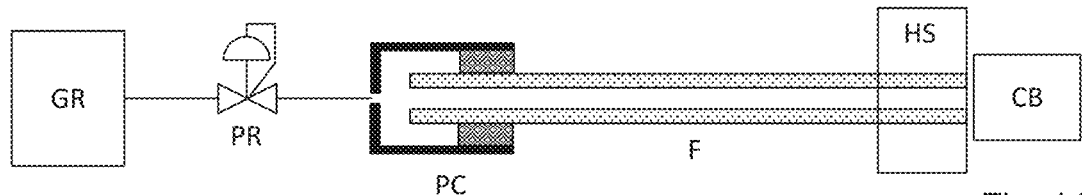
FIG. 14A, FIG. 14B, FIG. 14C, FIG. 14D and FIG. 14E schematically depict manufacturing methods for manufacturing HC-PCFs as illustrated in FIGS. 12 and 13.

FIG. 14A schematically illustrates an arrangement for a glassblowing example, where the glassblowing is performed after cleaving. In present fiber processing, the final step may comprise cleaving the fiber after internal capillary tapering. In order to create a trumpet shape to this fiber end, it is proposed to bring the tip of the fiber F in close proximity to a counter body CB (which could be for example a larger cross-sectional dimension solid fiber) and apply a gas pressure at the other end of the fiber F. In the example shown, the gas pressure is applied using a gas reservoir GR or gas source and pressure regulator PR, which may be introduced into fiber F via a pressure cap PC. The counter body CB allows for pressure build up at the fiber tip, provided that the distance to the fiber tip creates a dominant restriction for flow. This distance may be, for example, 5 µm or less since the inner cross-sectional dimension of the fiber is ~30 µm. Note, however, that the counter body CB should not be in contact with the fiber tip to avoid fusing or uncontrolled deformations in geometry. Once in close proximity and under pressure, the tip of the fiber can be heated by a heat source HS towards the softening temperature, at which point it will expand radially outward. It may be possible to perform this whole procedure in a conventional or commercially available splicer. In such splicers, the heat source may be, for example, an arc discharge or $CO_2$ laser. After expansion, the inner core cross-sectional dimension $D_{co}$ may be between 100 µm and 450 µm and outer core cross-sectional dimension $D_{out}$ between 150 µm and 500 µm, for example. The value of the trumpet length $L_{tp}$ may also be between 150 µm and 500 µm, and may be similar to the actual value of $D_{out}$.

Figure 14B:
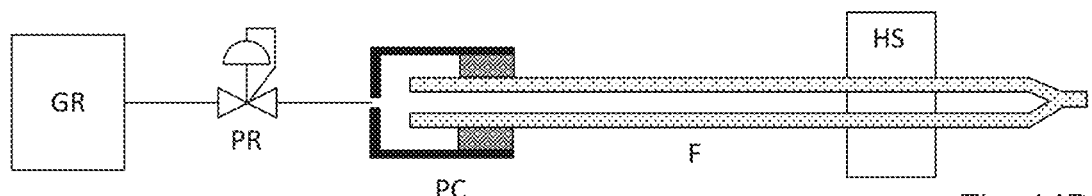

FIG. 14B schematically illustrates an arrangement for a glassblowing example, where the glassblowing is performed before cleaving. The arrangement expands the fiber end by applying pressure into the fiber before cleaving the fiber to its final length. This may be done in combination with or as replacement to any tapering step for tapering the internal capillaries ARE. By applying pressure to the fiber via gas reservoir GR and local heat via heat source HS, the fiber can be locally blown up to create a small bubble. After creating the bubble, the fiber can be cleaved at a position along the bubble length (e.g., at or around the widest point of the bubble) to obtain a trumpet shaped fiber end. Such an approach may result in similar values for the core cross-sectional dimensions and trumpet length as the method described by FIG. 14A.

Figure 14C:
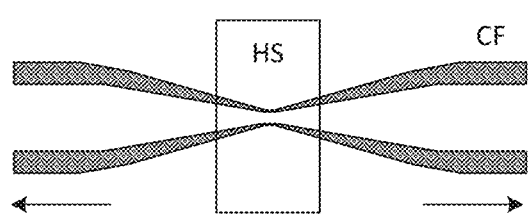

FIG. 14C illustrates a first step of a manufacturing method where the trumpet end section is manufactured as a separate component, e.g., from a capillary fiber CF. The capillary fiber CF may, for example have an approximately 1 mm outer cross-sectional dimension. By applying a heat source HS while pulling the fiber from both ends, a taper is created. The taper should be such that the inner cross-sectional dimension at (or around) the waist of this taper matches the inner cross-sectional dimension of the HC-PCF. The tapered capillary is cleaved (e.g., at a point where the inner cross-sectional dimension of the capillary fiber CF matches that of the HC-PCF). Once cleaved, the trumpet end section TP can be spliced to the end-face of the HC-PCF fiber F as illustrated in FIG. 14E. Both of these manufacturing steps can be performed using a conventional fiber splicer. Based on such a method, the inner core cross-sectional dimension $D_{co}$ may be between 300 μm and 800 μm and outer core cross-sectional dimension $D_{out}$ between 700 μm and 1200 μm, for example. The value of the trumpet length $L_{tp}$ may be between 3 mm and 7 mm.

Figure 14D:
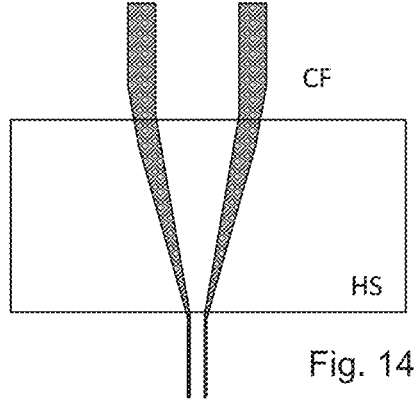
Figure 14E:
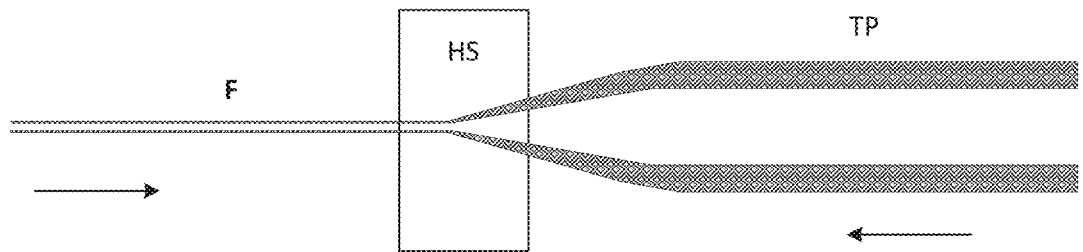

FIG. 14D illustrates a first step of a manufacturing method where the trumpet end section is manufactured as a separate component, e.g., from a capillary fiber CF. In this method, the trumpet end section TP is formed in a fiber drawing tower, where glass is pulled through the heat source HS. Once formed, the trumpet end section is spliced to the end-face of the HC-PCF in a fiber splicer, as illustrated in FIG. 14E. In this configuration a larger outer cross-sectional dimension can be achieved compared to the previous examples; for example, the inner core cross-sectional dimension $D_{co}$ may be of the order of magnitude of millimeters, e.g., between 1.5 mm and 4.5 mm and outer core cross-sectional dimension $D_{out}$ between 3 mm and 7 mm, for example. The value of the trumpet length $L_{tp}$ may be of the order of magnitude of centimeters, for example between 1 cm and 5 cm.

It should be noted that embodiments of the HC-PCF bulb or trumpet HC-PCF may be combined with the sleeved HC-PCF embodiment. For example, a HC-PCF bulb or trumpet HC-PCF may also comprise sleeves (e.g., as illustrated in FIG. 11A or 11B), which may be added before splicing of the tapered ends 920 or trumpet end section TP (or before the glassblowing step).

Embodiments are discussed in the subsequent numbered clauses:

1. An optical component, comprising:
   a hollow-core photonic crystal fiber comprising internal capillaries for guiding radiation and an outer capillary sheathing the internal capillaries; and
   at least an output end section having a larger inner diameter over at least a portion of the output end section than an inner diameter of the outer capillary along a central portion of the hollow-core photonic crystal fiber prior to the output end section.
2. An optical component according to clause 1, wherein the output end section is configured such that divergent broadband radiation emitted from the hollow-core photonic crystal fiber is not blocked by the output end section in an axial propagation direction.
3. An optical component according to clause 1 or clause 2, wherein the internal capillaries of the hollow-core photonic crystal fiber are collapsed to define a tapered core region at each end of the hollow-core photonic crystal fiber, the tapered core region comprising a region where a hollow core of the hollow-core photonic crystal fiber has an increasing diameter towards each end of the hollow-core photonic crystal fiber.
4. An optical component according to any of clauses 1 to 3, further comprising:
   an input end section;
   first and second transparent end caps sealing respective ends of the hollow-core photonic crystal fiber; and
   a gas medium sealed within a space collectively defined by the hollow-core photonic crystal fiber, end sections and end caps,
   wherein the input end section is comprised between an input end of the hollow-core photonic crystal fiber and the first end cap, and the output end section is comprised between an output end of the hollow-core photonic crystal fiber and the second end cap.
5. An optical component according to clause 4, wherein the input end section is configured such that convergent pump radiation admitted into the hollow-core photonic crystal fiber is not blocked by the input end section in an axial propagation direction.
6. An optical component according to clause 4 or clause 5, wherein one or both end sections are tapered end sections which taper outward to define an expanding inner diameter from the hollow-core photonic crystal fiber towards a respective end cap.
7. An optical component according to clause 4 or clause 5, wherein one or both end sections have a substantially uniform inner diameter between the hollow-core photonic crystal fiber and a respective end cap.
8. An optical component according to any of clauses 4 to 7, wherein the first transparent end cap is configured to receive a beam of pump radiation to excite the gas medium for supercontinuum generation, and the second transparent end cap is configured to emit an output beam resultant from the supercontinuum generation.
9. An optical component according to clause 8, wherein the first transparent end cap comprises an input lens for in-coupling the beam of pump radiation and/or the second transparent end cap comprises an output lens for collimating the output beam.
10. An optical component according to any of clauses 4 to 9, wherein the end caps are comprised of silica or borosilicate.
11. An optical component according to any of clauses 1 to 3, wherein the output end section widens outward to define an expanding inner diameter from the hollow-core photonic crystal fiber towards an output end of the output end section.
12. An optical component according to clause 11, wherein the output end section comprises a widened output end portion of at least the outer capillary.
13. An optical component according to clause 12, wherein the internal capillaries of the hollow-core photonic crystal fiber are shaped away from a longitudinal axis of the optical component at the output end section.
14. An optical component according to clause 13, wherein the internal capillaries are blended into the outer capillary at the output end section.

15. An optical component according to clause 11, wherein the output end section comprises an end section spliced or otherwise joined to the end of the hollow-core photonic crystal fiber.
16. An optical component according to any of clauses 11 to 15 wherein an inner diameter of the output end section at its widest point may be any value in the range of 100 μm to 4.5 mm.
17. An optical component according to any of clauses 1 to 16, wherein the hollow-core photonic crystal fiber comprises a fiber coating.
18. An optical component according to clause 17, wherein the fiber coating comprises a polymer.
19. An optical component according to any of clauses 1 to 18, wherein at least the output end section is comprised of silica or borosilicate.
20. A broadband radiation source device, being configured for generating a broadband output, comprising:
    an optical component according to any of clauses 1 to 19; and
    a mounting arrangement which clamps the optical component at one or more points on the end sections.
21. A broadband radiation source device as defined clause 20, further comprising a pump laser for outputting a plurality of pump pulses to excite the gas medium for supercontinuum generation.
22. A broadband radiation source device according to clause 20 or clause 21, wherein the broadband output comprises a wavelength range of 200 nm to 2000 nm, or a sub-range within this range.
23. A method of manufacturing an optical component of any of clauses 4 to 10, comprising:
    splicing each of the end sections, each with respective end cap attached, to respective ends of the hollow-core photonic crystal fiber; and
    filling the optical component with the gas medium.
24. A method according to clause 23, wherein the filling of the gas medium is performed before a final splice of the splicing step is performed.
25. A method according to clause 24, comprising:
    inserting, prior to the final splice, the optical component into an evacuated container;
    flushing the optical component with pressurized gas; and
    making the final splice in a high-pressure environment.
26. A method according to clause 25, wherein the flushing step comprises heating the hollow-core photonic crystal fiber while removing a nozzle used in the flushing step.
27. A method of manufacturing an optical component of any of clauses 12 to 14, comprising establishing a pressure differential between an internal region of the hollow-core photonic crystal fiber and outside of the hollow-core photonic crystal fiber, while locally applying heat to the hollow-core photonic crystal fiber such that the hollow-core photonic crystal fiber expands at a region where the heat is applied.
28. A method as claimed in claim 27, comprising initially cleaving an output end of the hollow-core photonic crystal fiber; and
    wherein the pressure differential is established by placing a counter body in a vicinity of the output end of the hollow-core photonic crystal fiber so as to impede flow from the output end and introduce a fluid at an input end of the hollow-core photonic crystal fiber.
29. A method as claimed in claim 27, comprising:
    establishing the pressure differential to form a bubble along the length of the hollow-core photonic crystal fiber where the heat is locally applied; and
    cleaving an output end of the hollow-core photonic crystal fiber at the bubble.
30. A method of manufacturing an optical component of clause 15, comprising:
    locally applying a heat source on a capillary fiber while applying a pulling force from both ends of the fiber to create a taper;
    cleaving the fiber at the taper to create the output end section; and
    splicing the output end section to an output end of the hollow-core photonic crystal fiber.
31. A method of manufacturing an optical component of clause 15, comprising:
    forming the output end section in a fiber drawing tower; and
    splicing the output end section to an output end of the hollow-core photonic crystal fiber.
32. An optical component, comprising:
    a hollow-core photonic crystal fiber; and
    a sleeve arrangement comprising at least one sleeve covering at least respective end portions of each end of the hollow-core photonic crystal fiber, wherein:
        internal capillaries of the hollow-core photonic crystal fiber are collapsed to define a tapered core region at each end of the hollow-core photonic crystal fiber, the tapered core region comprising a region where a hollow core of the hollow-core photonic crystal fiber has an increasing diameter towards each end of the hollow-core photonic crystal fiber; and
        contact regions, where the sleeve arrangement contacts the hollow-core photonic crystal fiber, are all at or beyond the tapered core region with respect to a main axis of the hollow-core photonic crystal fiber.
33. An optical component according to clause 32, wherein the sleeve arrangement comprises a first sleeve for covering a first end portion of the hollow-core photonic crystal fiber and a second sleeve for covering a second end portion of the hollow-core photonic crystal fiber.
34. An optical component according to clause 33, comprising:
    a gas cell for at least partially enclosing the hollow-core photonic crystal fiber and sleeve arrangement; and
    a gas medium contained within the gas cell.
35. An optical component according to clause 32, wherein the sleeve arrangement comprises a single sleeve covering the length of the hollow-core photonic crystal fiber.
36. An optical component according to clause 35, comprising first and second transparent end caps sealing respective ends of the sleeve, and a gas medium contained within the sleeve.
37. An optical component according to clause 36, wherein the first transparent end cap is configured to receive a beam of pump radiation to excite the gas medium for supercontinuum generation, and the second transparent end cap is configured to emit an output beam resultant from the supercontinuum generation.
38. An optical component according to clause 37, wherein the first transparent end cap comprises an input lens for in-coupling the beam of pump radiation and/or the second transparent end cap comprises an output lens for collimating the output beam.
39. An optical component according to any of clauses 32 to 38, wherein the sleeve arrangement extends beyond each end of the hollow-core photonic crystal fiber.
40. An optical component according to any of clauses 32 to 38, wherein the sleeve arrangement terminates at or close to each end of the hollow-core photonic crystal fiber.

41. An optical component according to any of clauses 32 to 40, wherein the sleeve arrangement comprises a taper towards the hollow-core photonic crystal fiber at each end of the hollow-core photonic crystal fiber towards the contact regions.
42. An optical component according to any of clauses 32 to 41, wherein each of the contact regions should comprise an axial length which is smaller than the tapering length of a respective tapered core region.
43. An optical component according to any of clauses 32 to 42, wherein the sleeve material comprises borosilicate glass, silica, or a chalcogenide, a tellurite or other soft glass.
44. A method of manufacturing an optical component of any of clauses 32 to 43, comprising:
    introducing the hollow-core photonic crystal fiber into the sleeve arrangement; and
    locally heating the sleeve arrangement to collapse it onto the hollow-core photonic crystal fiber.
45. A method according to clause 44, wherein the step of locally heating comprises adjusting heating strength and heating time during the step until a robust mechanically connection is realized, so as to minimize distortion of the hollow-core photonic crystal fiber.
46. A broadband radiation source device, being configured for generating a broadband output, comprising:
    an optical component according to any of clauses 32 to 43; and
    a mounting arrangement which clamps the optical component on the sleeve arrangement.
47. A broadband radiation source device as defined clause 46, further comprising a pump laser for outputting a plurality of pump pulses to excite a gas medium contained within the hollow-core photonic crystal fiber for supercontinuum generation.
48. A broadband radiation source device according to clause 46 or clause 47, wherein the broadband output comprises a wavelength range of 230 nm to 2300 nm, or a sub-range within this range.
49. A metrology device comprising a broadband radiation source device according to any of clauses 20 to 22, or clauses 46 to 48.
50. A metrology device according to clause 49, wherein the metrology device is operable as scatterometer metrology apparatus
51. A metrology device according to clause 49, wherein the metrology device is operable as a level sensor or an alignment sensor.
52. A lithographic apparatus comprising at least one the metrology device according to clause 51 for performing alignment and/or levelling metrology.
53. A lithographic cell comprising the lithographic apparatus of clause 52 and a metrology device according to clause 50.
54. An optical component, comprising:
    a hollow-core photonic crystal fiber;
    first and second transparent end caps sealing respective ends of the hollow-core photonic crystal fiber;
    end sections between each end of the hollow-core photonic crystal fiber and its respective end cap, the end sections comprising a larger inner diameter than an inner diameter of the hollow-core photonic crystal fiber over at least a portion of the end sections; and
    a gas medium sealed within a space collectively defined by the hollow-core photonic crystal fiber, end sections and end caps.
55. An optical component according to clause 54, wherein one or both end sections are tapered end sections which taper outward to define an expanding inner diameter from the hollow-core photonic crystal fiber towards a respective end cap.
56. An optical component according to clause 54, wherein one or both end sections have a substantially uniform inner diameter between the hollow-core photonic crystal fiber and a respective end cap.
57. An optical component according to any of clauses 54 to 56, wherein the end sections are configured such that divergent broadband radiation emitted from the hollow-core photonic crystal fiber and/or convergent pump radiation admitted into the hollow-core photonic crystal fiber is not blocked by a respective end section in an axial propagation direction.
58. An optical component according to any of clauses 54 to 57, wherein the first transparent end cap is configured to receive a beam of pump radiation to excite the gas medium for supercontinuum generation, and the second transparent end cap is configured to emit an output beam resultant from the supercontinuum generation.
59. An optical component according to clause 58, wherein the first transparent end cap comprises an input lens for in-coupling the beam of pump radiation and/or the second transparent end cap comprises an output lens for collimating the output beam.
60. An optical component according to any of clauses 54 to 59, wherein internal capillaries of the hollow-core photonic crystal fiber are collapsed to define a tapered core region at each end of the hollow-core photonic crystal fiber, the tapered core region comprising a region where a hollow core of the hollow-core photonic crystal fiber has an increasing diameter towards each end of the hollow-core photonic crystal fiber.
61. An optical component according to any of clauses 54 to 60, wherein the hollow-core photonic crystal fiber comprises a fiber coating.
62. An optical component according to clause 61, wherein the fiber coating comprises a polymer.
63. An optical component according to any of clauses 54 to 62, wherein the end sections and/or end caps are comprised of silica or borosilicate.
64. A broadband radiation source device, being configured for generating a broadband output, comprising:
    an optical component according to any of clauses 54 to 63; and
    a mounting arrangement which clamps the optical component at one or more points on the end sections.
65. A broadband radiation source device as defined clause 64, further comprising a pump laser for outputting a plurality of pump pulses to excite the gas medium for supercontinuum generation.
66. A broadband radiation source device according to clause 64 or clause 65, wherein the broadband output comprises a wavelength range of 200 nm to 2000 nm, or a sub-range within this range
67. A method of manufacturing an optical component of any of clauses 54 to 63, comprising:
    splicing each of the end sections, each with respective end cap attached, to respective ends of the hollow-core photonic crystal fiber; and
    filling the optical component with the gas medium.
68. A method according to clause 67, wherein the filling of the gas medium is performed before a final splice of the splicing step is performed.

69. A method according to clause 68, comprising:
inserting, prior to the final splice, the optical component into an evacuated container;
flushing the optical component with pressurized gas; and
making the final splice in a high-pressure environment.
70. A method according to clause 69, wherein the flushing step comprises heating the hollow-core photonic crystal fiber while removing a nozzle used in the flushing step.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a patterning device (mask) inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An optical component, comprising:
a hollow-core photonic crystal fiber comprising a hollow core forming a non-solid space, internal capillaries for guiding radiation and located around the hollow core, and an outer capillary sheathing the internal capillaries; and
at least an output end section having a larger inner cross-sectional dimension over at least a portion of the output end section than an inner cross-sectional dimension of the outer capillary along a central portion of the hollow-core photonic crystal fiber prior to the output end section,
wherein internal capillaries of the hollow-core photonic crystal fiber are collapsed at an end of the hollow-core photonic crystal fiber such that, along a direction moving toward the end, the capillaries reduce in cross-sectional dimension while a region of the hollow core increases in cross-sectional dimension.

2. The optical component according to claim 1, wherein the output end section is configured such that divergent radiation emitted from the hollow-core photonic crystal fiber is not blocked by the output end section in an axial propagation direction.

3. The optical component according to claim 1, wherein internal capillaries of the hollow-core photonic crystal fiber are collapsed to define a tapered core region at each end of the hollow-core photonic crystal fiber, the tapered core region comprising a region where a hollow core of the hollow-core photonic crystal fiber has an increasing cross-sectional dimension towards each end of the hollow-core photonic crystal fiber.

4. The optical component according to claim 1, further comprising:
an input end section;
first and second transparent end caps sealing respective ends of the hollow-core photonic crystal fiber; and
a gas medium sealed within a space collectively defined by the hollow-core photonic crystal fiber, end sections and end caps,
wherein the input end section is comprised between an input end of the hollow-core photonic crystal fiber and the first end cap, and the output end section is comprised between an output end of the hollow-core photonic crystal fiber and the second end cap.

5. The optical component according to claim 4, wherein the first end cap is configured to receive a beam of pump radiation to excite the gas medium for broadened radiation generation, and the second end cap is configured to emit an output beam resultant from the broadened radiation generation.

6. The optical component according to claim 1, wherein the hollow-core photonic crystal fiber comprises a fiber coating.

7. The optical component according to claim 1, wherein the output end section widens outward to define an expanding inner cross-sectional dimension from the hollow-core photonic crystal fiber towards an output end of the output end section; and
wherein:
the output end section comprises a widened output end portion of at least the outer capillary, or
the output end section comprises an end section spliced or otherwise joined to the end of the hollow-core photonic crystal fiber.

8. A broadband radiation source device configured to generate a broadband output, the broadband radiation source comprising:
the optical component as claimed claim 1; and
a mounting arrangement which clamps the optical component at one or more points on the end sections.

9. A metrology device comprising the broadband radiation source device as claimed in claim 8.

10. A method of manufacturing the optical component of claim 1, the method comprising:
splicing the output end section and an input end section, each with a respective end cap attached, to respective ends of the hollow-core photonic crystal fiber; and
filling the optical component with the gas medium.

11. An optical component, comprising:
a hollow-core photonic crystal fiber comprising a hollow core forming a non-solid space, and internal capillaries for guiding radiation and located around the hollow core; and
at least an output end section attached to the fiber and extending beyond the ends of the internal capillaries, the output end section having a larger inner cross-sectional dimension over at least a portion of the output end section than an outer cross-sectional dimension of the internal capillaries along a central portion of the hollow-core photonic crystal fiber prior to the output end section.

12. The optical component according to claim 11, wherein the output end section is configured such that divergent radiation emitted from the hollow-core photonic crystal fiber is not blocked by the output end section in an axial propagation direction.

13. The optical component according to claim 11, wherein internal capillaries of the hollow-core photonic crystal fiber are collapsed to define a tapered core region at least at an output end of the hollow-core photonic crystal fiber, the tapered core region comprising a region where a hollow core of the hollow-core photonic crystal fiber has an increasing cross-sectional dimension towards the output end of the hollow-core photonic crystal fiber.

14. The optical component according to claim 11, further comprising:
    an input end section;
    first and second transparent end caps sealing respective ends of the hollow-core photonic crystal fiber; and
    a gas medium sealed within a space collectively defined by the hollow-core photonic crystal fiber, end sections and end caps,
    wherein the input end section is comprised between an input end of the hollow-core photonic crystal fiber and the first end cap, and the output end section is comprised between an output end of the hollow-core photonic crystal fiber and the second end cap.

15. The optical component according to claim 14, wherein the first end cap is configured to receive a beam of pump radiation to excite the gas medium for broadened radiation generation, and the second end cap is configured to emit an output beam resultant from the broadened radiation generation.

16. The optical component according to claim 11, wherein the hollow-core photonic crystal fiber comprises a fiber coating.

17. The optical component according to claim 11, wherein the output end section widens outward to define an expanding inner cross-sectional dimension from the hollow-core photonic crystal fiber towards an output end of the output end section; and
    wherein:
        the output end section comprises a widened output end portion of at least an outer capillary, or
        the output end section comprises an end section spliced or otherwise joined to the end of the hollow-core photonic crystal fiber.

18. A broadband radiation source device configured to generate a broadband output, the broadband radiation source comprising:
    the optical component as claimed claim 11; and
    a mounting arrangement which clamps the optical component at one or more points on the end sections.

19. A metrology device comprising the broadband radiation source device as claimed in claim 18.

20. A method of manufacturing the optical component of claim 11, the method comprising:
    splicing the output end section and an input end section, each with a respective end cap attached, to respective ends of the hollow-core photonic crystal fiber; and
    filling the optical component with the gas medium.

21. An optical component, comprising:
    a hollow-core photonic crystal fiber comprising a hollow core forming a non-solid space, internal capillaries for guiding radiation and located around the hollow core, and an outer capillary sheathing the internal capillaries; and
    at least an output end section being a separate structure from the outer capillary, the at least an output end section having a larger inner cross-sectional dimension over at least a portion of the output end section than an inner cross-sectional dimension of the outer capillary along a central portion of the hollow-core photonic crystal fiber prior to the output end section.

* * * * *